US009899450B2

(12) United States Patent
Strukov et al.

(10) Patent No.: US 9,899,450 B2
(45) Date of Patent: Feb. 20, 2018

(54) MEMRISTORS AND METHOD FOR FABRICATING MEMRISTORS (71) Applicant: The Regents of the University of California, Oakland, CA (US)

(72) Inventors: Dmitri Strukov, Goleta, CA (US); Mirko Prezioso, Goleta, CA (US); Farnood Merrik-Bayat, Goleta, CA (US); Brian Hoskins, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/854,650

(22) Filed: Sep. 15, 2015

(65) Prior Publication Data
US 2017/0077182 A1  Mar. 16, 2017

(51) Int. Cl.
*H01L 27/24* (2006.01)
*H01L 45/00* (2006.01)

(52) U.S. Cl.
CPC ........ *H01L 27/2463* (2013.01); *H01L 45/085* (2013.01); *H01L 45/1233* (2013.01); *H01L 45/1246* (2013.01); *H01L 45/1253* (2013.01); *H01L 45/146* (2013.01); *H01L 45/147* (2013.01); *H01L 45/1625* (2013.01)

(58) Field of Classification Search
CPC ....... H01L 45/12; H01L 41/12; H01L 45/147; H01L 45/085; H01L 27/2463; C11C 13/0007
See application file for complete search history.

(56) References Cited

U.S. PATENT DOCUMENTS

| | | | |
|---|---|---|---|
| 6,870,755 B2 | 3/2005 | Rinerson et al. | |
| 7,292,469 B2 | 11/2007 | Lee et al. | |
| 7,359,888 B2 | 4/2008 | Snider | |
| 7,417,271 B2 | 8/2008 | Genrikh et al. | |
| 8,565,004 B2 * | 10/2013 | Iijima | G11C 11/5685 365/148 |
| 8,686,389 B1 * | 4/2014 | Wang | H01L 45/145 257/2 |
| 8,766,234 B1 | 7/2014 | Hashim et al. | |
| 9,203,019 B2 * | 12/2015 | Kim | G11C 13/0007 |
| 2006/0171200 A1 | 8/2006 | Rinerson et al. | |
| 2012/0001141 A1 | 1/2012 | Hsieh et al. | |
| 2012/0292584 A1 | 11/2012 | Rocklein et al. | |
| 2014/0042380 A1 | 2/2014 | Kim et al. | |
| 2014/0367631 A1 | 12/2014 | Govoreanu | |

OTHER PUBLICATIONS

Konstantin K. Likharev, "CrossNets: Neuromorphic Hybrid CMOS/Nanoelectric Networks", Science of Advanced Materials, vol. 3, pp. 322-331, published in May of 2011.
Strukov et al., "Four-Dimensional Address Topology for Circuits with Stacked Multilayer Crossbar Arrays", Hewlett-Packard Laboratories. Proceedings of the National Academy of Sciences, published Nov. 2009, www.pnas.org/cgi/doi/10.1073/pnas.0906949106.

* cited by examiner

*Primary Examiner* — Tran Tran
(74) *Attorney, Agent, or Firm* — Socal IP Law Group, LLP; John E. Gunther; Mark A. Goldstein (57) ABSTRACT

There are disclosed memristors and memristor fabrication methods. A memristor may include a stack of four functional elements including, in sequence, a first electrode, a barrier layer, an oxygen-deficient switching layer, and a second electrode.

10 Claims, 7 Drawing Sheets

SECTION A-A

MEMRISTORS AND METHOD FOR FABRICATING MEMRISTORS

GOVERNMENT INTERESTS

This invention was made with Government support under Contract FA9550-12-1-0038 awarded by the Air Force Office of Science Research. The Government has certain rights in the invention.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to memristor devices and to memristor devices suitable for implementation of neuromorphic networks.

Description of the Related Art

A memristor is a two-terminal electronic component having a resistance that is not constant, but rather is determined by the history of the voltages applied to, or the currents that flowed through, the device. A memristor device may be used in a binary mode in which voltage pulses of opposing polarity may be used to switch the device to either a "on" state (i.e. a low resistance state) or "off" state (i.e. a high resistance state). The state of the device may then be interrogated by applying a voltage less than a threshold voltage needed to cause the device to change state and measuring the current flow through the device. Arrays of memristor devices operated in the binary mode have the potential to provide very dense nonvolatile digital memories.

Some memristor devices may be operated in an analog mode in which the resistance of the devices may be set to any value between a minimum (i.e. fully "on") and a maximum (i.e. fully "off") value. The ratio of the maximum resistance to the minimum resistance may vary by four orders of magnitude or more. Arrays of analog memristors may be used to implement neuromorphic networks which, in over-simplified terms, are electronic networks that mimic the operation of neurons.

Memristors have been fabricated using a variety of switching materials, which is to say materials that are capable of switching between high and low conductivity states. Many of these memristor devices require "forming" (also called "electroforming") before the devices can be switched. To form a memristor, a current-limited DC voltage may be applied across the memristor. The applied voltage may be gradually increased to a level, called the "forming voltage", where an abrupt increase in current thought the memristor occurs. Equivalently, a DC current may be forced through the memristor. The current may be gradually increased until the voltage across the memristor reaches the forming voltage, where an abrupt drop in the voltage across the device occurs. With either technique, forming is a one-time operation after which the memristor exhibits switching behavior as previously described. The exact mechanism of forming may not be the same for all switching materials, but may involve aligning or aggregating dopants or other conductive species within the switching material.

A memristor within a memristor array may be formed as described in the previous paragraph by applying the forming voltage between the appropriate row and column electrodes with the unused row and column electrodes floating. During forming, a fraction of the forming voltage is applied across every other memristor in the array. The current flow through individual unformed memristors and formed memristors switched to their "off" states may be small compared to the current flow through the memristor being formed. However, the current flow though any formed memristor in the "on" state may be substantial and possibly high enough to cause damage to the memristor array. To allow one memristor in an array to be formed without inadvertently turning on other memristors in the array, the forming voltage of each memristor is preferably not more than about two times the voltage required to switch a previously-formed memristor from the off to on states.

Memristor devices that require higher switching voltages may be used in memristor arrays if some form of select device is integrated in series with the memristor. The select device may be, for example, a diode or a switching transistor.

Throughout this description, elements appearing in figures are assigned three-digit reference designators, where the most significant digit is the figure number and the two least significant digits are specific to the element. An element that is not described in conjunction with a figure may be presumed to have the same characteristics and function as a previously-described element having a reference designator with the same least significant digits.

DETAILED DESCRIPTION

Description of Apparatus

Figure 1:
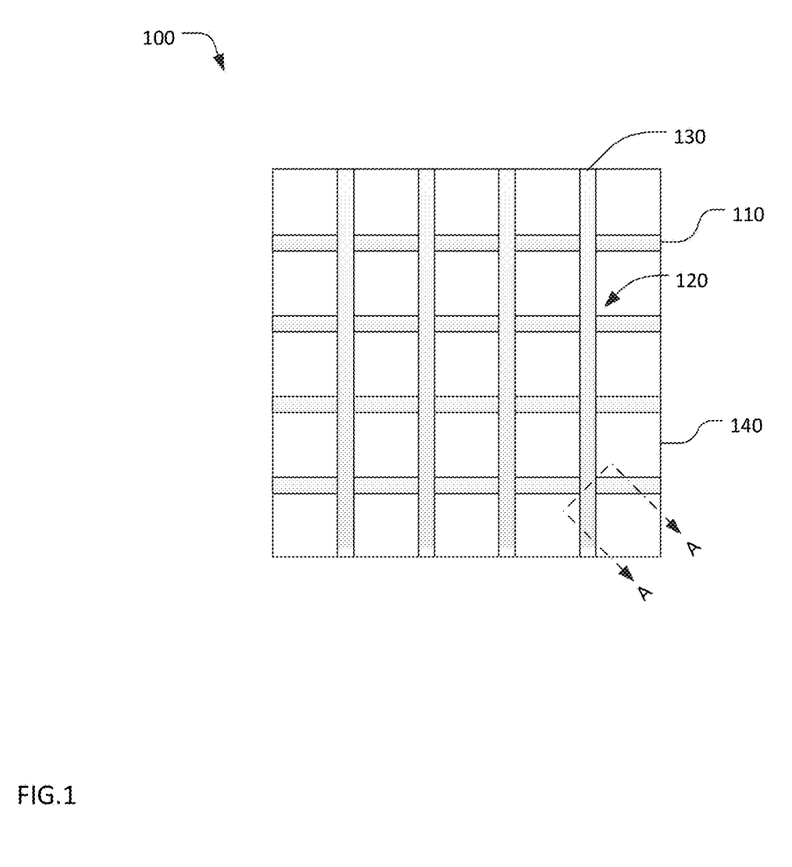
FIG. 1 is a schematic plan view of a memristor array.

Referring now to FIG. 1, an exemplary memristor array 100 includes a plurality of row electrodes 110, and a plurality of column electrodes 130 fabricated upon a substrate 140. Note that the terms "row" and "column" refer to the orientation of the electrodes as shown in the figure and do not imply any absolute orientation of the electrodes or the memristor array. The row electrodes run generally in parallel in a first direction. The column electrodes run generally parallel in a second direction different from, and typically orthogonal to, the first direction. The memristor array 100 also includes a plurality of memristor devices 120 at the intersections of the row electrodes 110 and column electrodes 130. The example of FIG. 1 includes four row electrodes, four column electrodes, and sixteen memristor devices. A memristor array may have more or fewer than four row and/or column electrodes and more or fewer than sixteen memristor devices.

Ideally, memristors for use in memristor arrays would have uniform characteristics and highly nonlinear current-voltage characteristics to allow memristors in the array to be interrogated without inadvertently altering their states. Further, memristors for use in memristor arrays would have low switching and forming voltages for low power consumption and integrated circuit compatibility. Additionally, memristors for use in memristor arrays would preferably be fabricated using low temperature processes compatible with integrated circuits to allow memristor arrays to fabricated along side of, or on top of, processors or other electronic circuitry.

Figure 2:
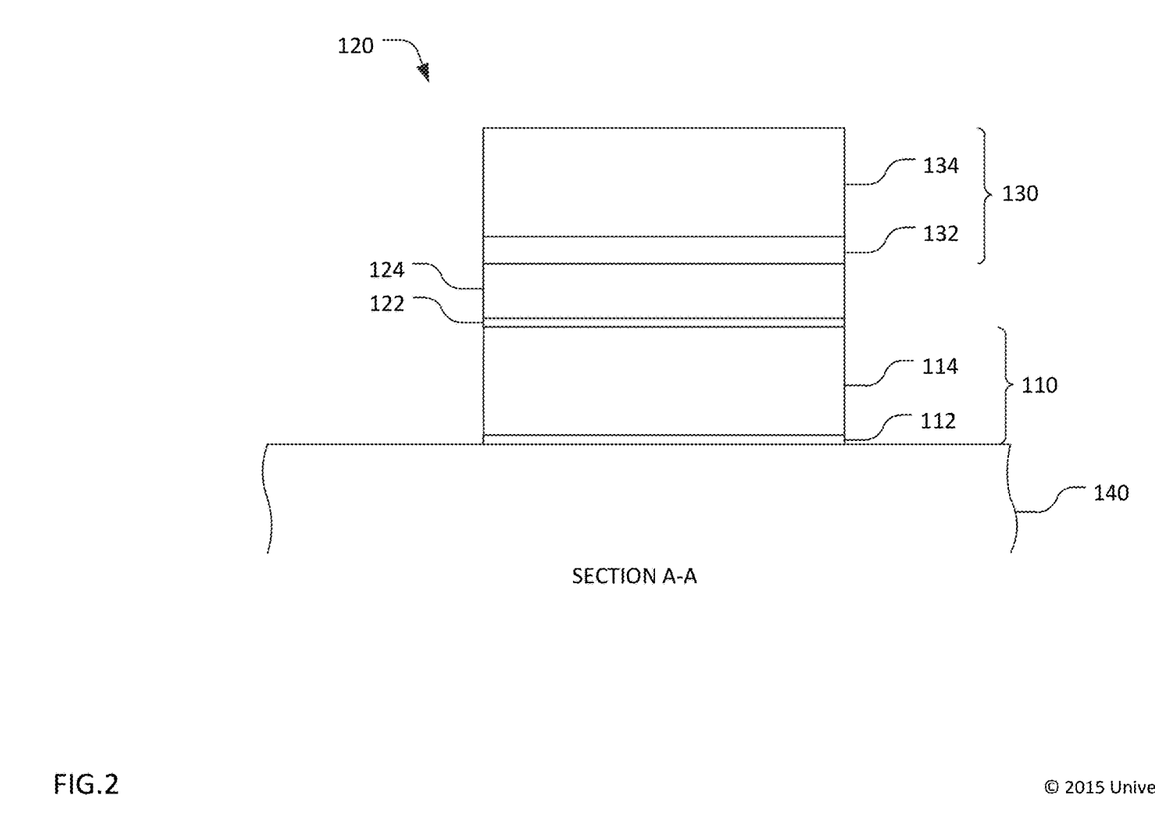
FIG. 2 is a schematic cross sectional view of a memristor device.

FIG. 2 is a schematic diagram of a cross section of the memristor array 100 of FIG. 1 through one of the memristors 120. The memristor 120 consists of a stack of four functional elements formed on a substrate 140. The four functional elements of the memristor 120 include, in sequence, a first (row) electrode 110, a barrier layer 122, a switching layer 124, and a second (column) electrode 130. The substrate 140 may be, in principle, any nonflexible insulting material. A convenient material for the substrate 140 may be, for example, an oxidized silicon wafer. The stack of four functional elements may be inverted, maintaining the sequence of the functional elements. Note that, in this context, "sequence" refers to the relative positions of the four functional elements with respect to each other, which is not necessarily the order in which the four functional elements are deposited on the substrate during fabrication.

The first electrode 110 may include a thin adhesion layer 112 and a conductor layer 114. The conductor layer 114 may be, for example, platinum, which is unreactive, highly conductive, and has lower permeability for oxygen that some other metals such as gold. Other metals that may be used for the conductor layer 114 include gold and aluminum. Further, conductive metal-silicates, such as CoSi2, TiSi2, NiSi may be used for the conductor layer 114. The thickness of the conductor layer 114 may be selected to ensure that the resistance of the first electrode 110 is low compared to the minimum resistance of the memristor.

The adhesion layer 112 may be a material selected to provide high adhesion between the material of the conductor layer 114 and the substrate 140. For example, in the case where the conductor layer 114 is platinum and the substrate 140 is oxidized silicon, the adhesion layer 112 may be tantalum. Other materials that may be used for the adhesion layer 112 include tungsten, aluminum, titanium, chromium, and nickel. The thicknesses of the adhesion layer 112 and the conductor layer 114 may be about 5 nm and 25 to 60 nm, respectively, for example.

The switching layer 124 may be a non-stoichiometric oxygen-deficient metal oxide or perovskite switching material, which is to say a material capable of switching between high and low resistance states. Known switching materials include metal oxides such as $MgO$, $TiO_x$, $ZrO_x$, $HfO_x$, $VO_x$, $NbO_x$, $TaO_x$, $CrO_x$, $MoO_x$, $WO_x$, $MnO_x$, $FeO_x$, $CoO_x$, $NiO_x$, $CuO_x$, $ZnO_x$, $AlO_x$, $GaO_x$, $SiO_x$, $SiO_xN_y$, $GeO_x$, $SnO_2$, $BiO_x$, $SbO_x$; oxides of rare-earth metals including Y, Ce, Sm, Gd, Eu, Pr, Er, Dy and Nd; and perovskites such as $SrTiO_3$, $Ba_{0.7}Sr_{0.3}TiO_3$, $SrZrO_3$, $BiFeO_3$, $Pr_{0.7}Ca_{0.3}MnO_3$, $La_{0.33}Sr_{0.67}FeO_3$, $Pr_yLa_{0.625-y}Ca_{0.375}MnO_3$. In these and other materials, oxygen vacancies serve as conductive species within the switching layer.

Figure 3:
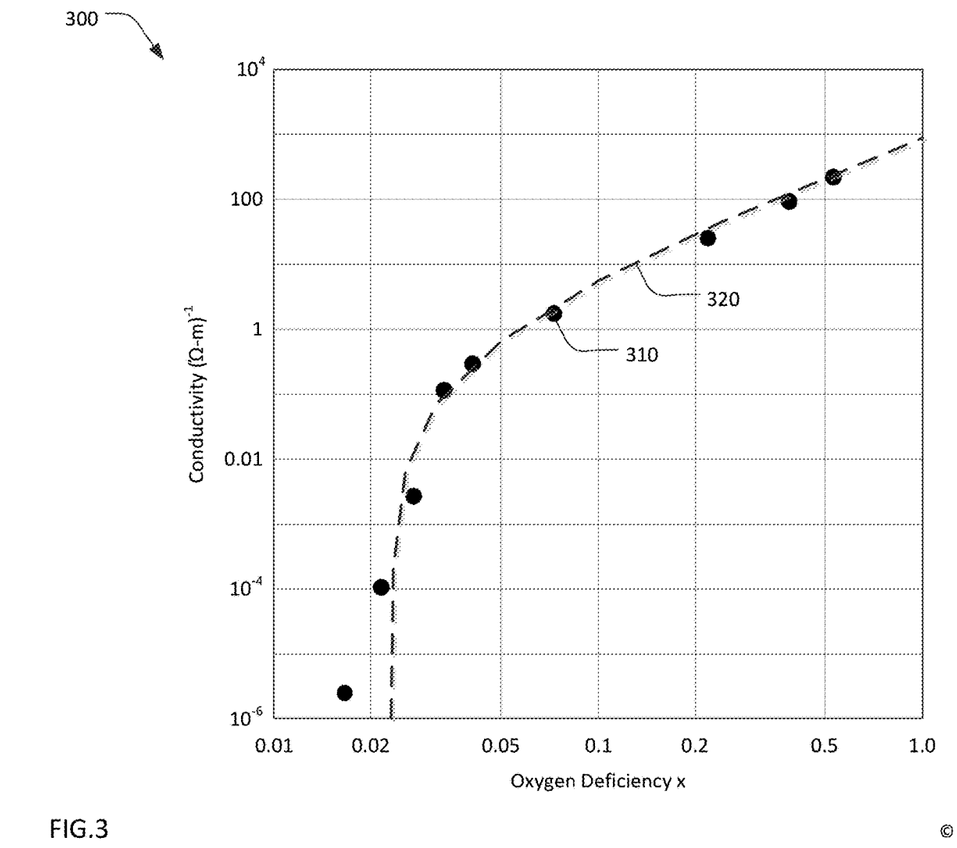
FIG. 3 is a graph of the relationship between oxygen deficiency level and conductivity of amorphous $TiO_{2-x}$.

An exhaustive experimental search over a range of titanium dioxide compositions, switching layer thicknesses between 5 nm and 100 nm, and barrier layer thicknesses was performed. It was found that a critical parameter affecting switching voltage of memristors using oxygen-deficient metal-oxide switching layers is the degree of oxygen deficiency. FIG. 3 shows a graph 300 of effect of oxygen deficiency x on conductivity of amorphous $TiO_{2-x}$. The black dots represent experimental datapoints. As can be seen from this data, the material undergoes a percolative transition from an insulator to a conductor at x equal to about 0.03. For values of x below the threshold of the percolative transition, the conductivity is very low and changes dramatically with x. The conductivity changes by several orders of magnitude as x is increased from 0.02 to 0.03. Above the threshold of the percolative transition, the conductivity of the material is approximately proportional to $x^2$ for values of x above 0.03. The dashed line 320 is a fit of a theoretical model of tunneling percolation to the experimental data. While the results shown in FIG. 3 are specific to amorphous $TiO_{2-x}$, other oxygen-deficient metal oxide switching materials undergo similar percolative transitions from highly insulating to conductive at particular levels of oxygen deficiency.

For $TiO_{2-x}$ switching layers, the inventors found that oxygen deficiency levels below about 0.023 resulted in high resistance memristors that either remained permanently off or required forming voltages substantially larger than twice their switching voltages. At the other extreme, oxygen deficiency levels above about 0.03 resulted in permanently conductive memristors that switched unreliably or remained permanently on. Oxygen deficiency levels between 0.023 and 0.030 resulted in memristor device with reliable low voltage switching and average forming voltage slightly higher than twice the average off-to-on switching voltage.

To achieve high on state to off state current ratios, the thickness of the switching layer 124 needs to be greater than the Debye length within the switching layer, which is about 10 nm for a $TiO_{2-x}$ switching layer. The thickness of the switching layer 124 may be, for example, 20 to 40 nm.

To increase the nonlinearity of the memristor conductivity, a dielectric barrier layer 122 is provided between the switching layer 124 and the first electrode 110. The barrier layer needs to be nonreactive with the other material used in the memristor and have low trap and impurity density. The barrier layer 122 may be, for example, aluminum oxide ($Al_2O_3$) aluminum Nitride (AlN) or silicon dioxide ($SiO_2$). Experimental results show that an $Al_2O_3$ barrier layer thickness of 3-5 nm provides a good compromise between lower switching and forming voltages and manufacturability. Thinner barrier layers are difficult to manufacture uniformly and may suffer from pinhole defects. Thicker barrier layers increase the memristor switching and forming voltages.

The second electrode 130 may include a contact layer 132 and a conductor layer 134. The contact layer may be selected to provide an ohmic contact to the switching layer 124 of the memristor devices. Further, the contact layer may be a getter material that removes, or "gets", oxygen from the switching material at the interface between the contact layer and the switching layer. The getter material may be a metal having an oxide that is as stable or more stable as the switching material. For example, in the case where the switching layer is $TiO_{2-x}$, the contact/getter layer may be titanium or aluminum. When the switching layer is HfOx, the contact/getter layer may be Ti or Al or Hf. When the switching layer is WOx, the contact/getter layer may be Ti, Al, Hf, or W.

The conductor layer 134 may be, for example, platinum, gold, or aluminum. The thickness of the conductor layer may be selected to ensure that the resistance of the second electrode 130 is low compared to the minimum resistance of the memristor devices. The thickness of the contact layer 132 and the conductor layer 134 may be about 15 nm and 25 to 60 nm, respectively, for example.

Memristor devices incorporating a $TiO_{2-x}$ switching layer, with $0.023 \leq x \leq 0.03$, an $Al_2O_3$ barrier layer 3 to 5 nm thick, and a titanium contact/getter layer have low forming and switching voltage and improved uniformity compared to other devices reported in the literature. Such devices are suitable for use in memristor arrays without requiring a select device in series with each memristor.

Figure 4:
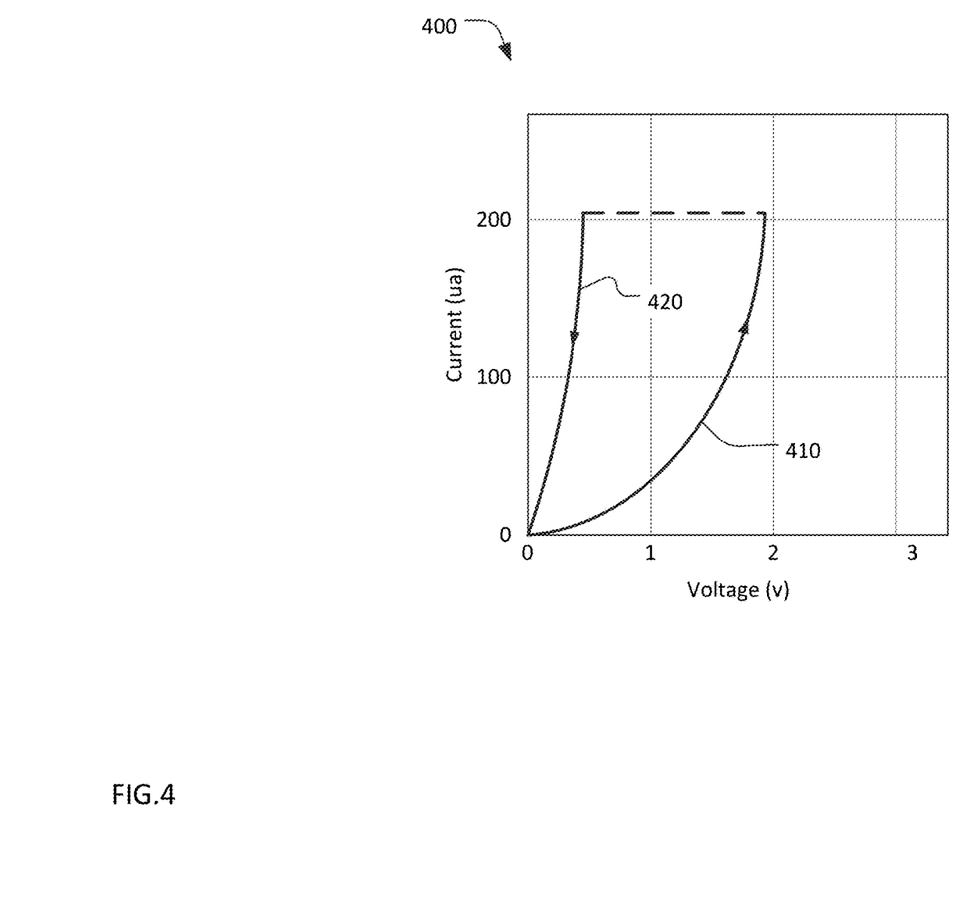
FIG. 4 is a graph of the current/voltage characteristics of a typical memristor device during forming.

FIG. 4 shows a graph 400 of the current-voltage (I-V) characteristics of a typical memristor of this type during forming. The solid curve 410 is the nonlinear I-V characteristic of an unformed memristor. The solid curve 420 is the I-V characteristic of the memristor after forming. To form the memristor, a DC current ramp may be applied to the memristor, causing the voltage across the device to increase from 0 to the forming voltage along the curve 410. When the voltage across the device reaches the forming voltage (1.95 volts in this example), the voltage across the device abruptly decreases as indicated generally by the dashed line. Once formed, the I-V characteristics of the device follow the curve 420. 8×10 arrays of memristor devices of this type had an average forming voltage of 1.91 volts with a standard deviation of 0.07 volts.

Figure 5:
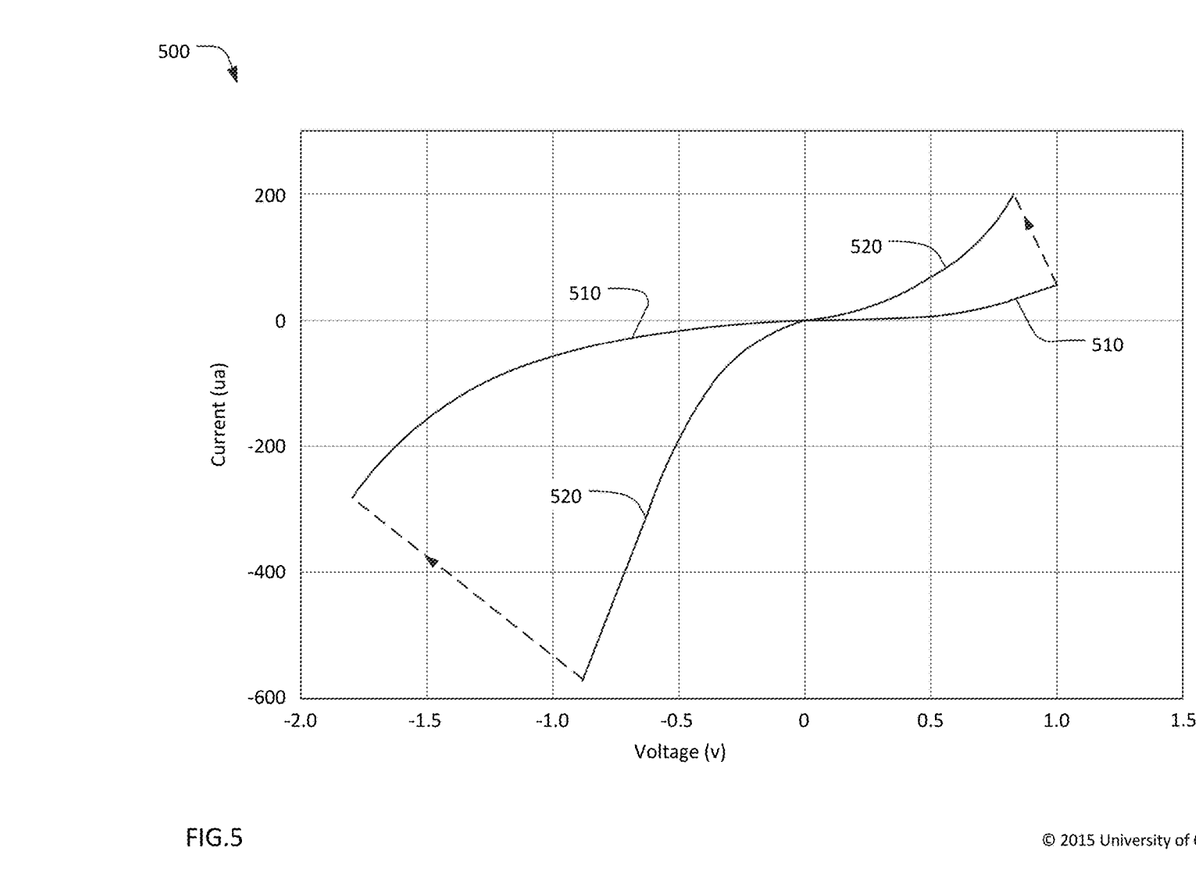
FIG. 5 is a graph of the current/voltage characteristics of a typical memristor device after forming.

FIG. 5 shows a graph 500 of the current-voltage (I-V) characteristics of a typical memristor incorporating a $TiO_{2-x}$ switching layer, with $0.023 \leq x \leq 0.03$, and an $Al_2O_3$ barrier layer 3 to 5 nm thick. The curve 510 is the IV characteristic of the memristor in its "off" state. The curve 520 is the IV characteristic of the memristor in an "on" state. The memristor can be switched from the off state (curve 510) to the on state (curve 520) or intermediate partially on states by applying a positive voltage above a memristor positive switching threshold voltage. The degree of switching (i.e. fully or partially on) may be controlled by the magnitude and duration of the applied switching voltage. The memristor can be switched from the on state (curve 520) to the off state (curve 510) or intermediate partially on states by applying a negative voltage below the memristor negative switching threshold voltage. The degree of switching (i.e. fully or partially on) may be controlled by the magnitude and duration of the applied switching voltage. 8×10 arrays of memristor devices of this type had an average off-to-on switching threshold voltage of 0.9 volts with a standard deviation of 0.1 volts, and an average on-to-off switching threshold voltage of −1.17 volts with a standard deviation of 0.12 volts.

While the results discussed above are specific to memristor devices having $TiO_{2-x}$ switching layers, similar memristor devices may be fabricated using other switching materials. Many, if not all, of the previously-identified switching materials will under a percolative transition from an insulator to a conductor at some level of oxygen deficiency. For any material that undergoes the percolative transition, a maximum oxygen deficiency level for a memristor switching layer may be defined at or just below a threshold oxygen deficiency level for the percolative transition (e.g. the oxygen deficiency level at the knee of the curve 320 in FIG. 3). The threshold oxygen deficiency level at the knee of the percolative transition may be determined experimentally and/or from the theory of percolative tunneling. A minimum oxygen deficiency level for a memristor switching layer may be defined as an oxygen deficiency level at which memristor forming voltage exceeds twice memristor switching voltage. The minimum oxygen deficiency level may be determined experimentally. Memristor devices fabricated with the oxygen deficiency level of the switching layer between the maximum and minimum oxygen deficiency levels thus defined may be suitable for use in memristor arrays without additional select devices.

Description of Processes

Figure 6:
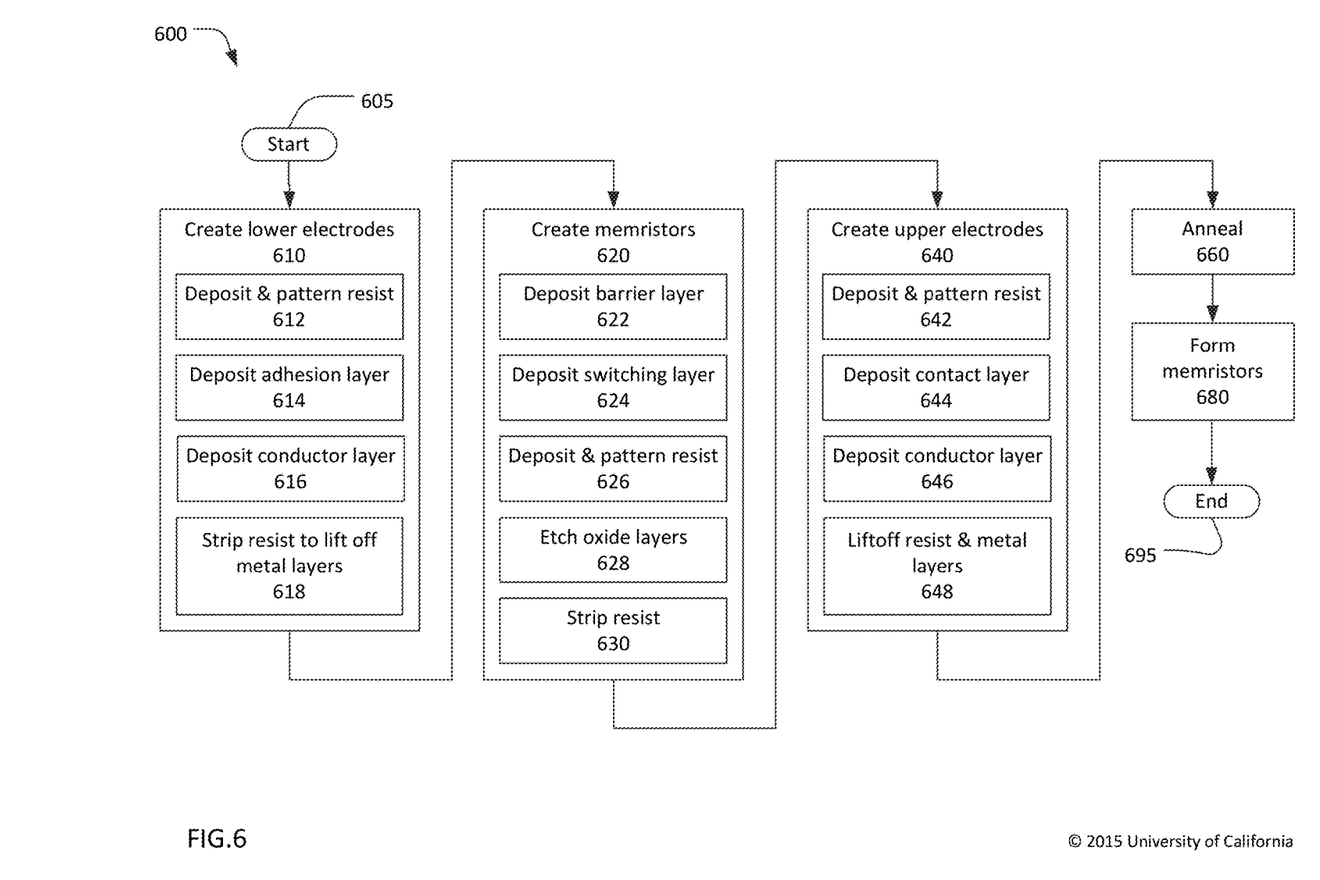
FIG. 6 is a flow chart of a process for fabricating a memristor array.

FIG. 6 is a flow chart of a process 600 for fabricating a memristor or memristor array beginning at 605 and ending at 695. The primary stages of the process 600 are creating the lower electrodes 610, creating the memristor devices 620, creating the upper electrodes 640, annealing the completed devices 660, and forming (also termed "electroforming") the memristor devices 680. The actions at 610, 630, and 640 may typically be performed on wafers or substrates containing multiple memristor or memristor array devices. Annealing may be performed on substrates or individual devices excised from a substrate. The flow chart of the process 600 only shows major process steps and other intermediate steps (e.g. wafer cleaning, surface preparation, inspection, dicing, packaging, etc.) may be performed as part of and integrated in the process 600.

At 610 lower electrodes, which may be either the row electrodes or the column electrodes, may be created using any known processes for creating metal conductors on a substrate. For example, the lower electrodes may be patterned using a lift-off process. At 612 a photoresist material may be deposited on the substrate, exposed through a mask, and developed to define the locations of the lower electrodes. An adhesion layer may be deposited over the developed photoresist at 614, followed by deposition of a conductor layer at 616. For example, the adhesion layer may be tantalum about 5 nm thick and the conductor layer may be platinum 25 to 60 nm thick. Both metals may be deposited by electron-beam evaporation, thermal evaporation, sputtering, or any other processes suitable for depositing these materials. After deposition of the metal layers, the photoresist may be stripped at 618, which lifts off the excess metal, leaving the lower electrodes. Alternatively, at 610, the lower electrodes may be created using a subtractive process in which adhesion and conductor layers are deposited on the substrate, resist is deposited and patterned on top of the metal layers, and the excess metal is removed by etching.

After the lower electrodes are created at 610, the memristors may be created at 620. The barrier layer may be deposited at 622. The barrier layer may be, for example, $Al_2O_3$ or another dielectric material 3 to 5 nm thick. The barrier layer may be deposited by sputtering or some other deposition process appropriate for the material being deposited.

The switching layer may be deposited over the barrier layer at 624. As previously described, the switching layer may be an oxygen-deficient metal oxide material. In the example case where the switching layer is $TiO_{2-x}$ ($0.23 \leq x \leq 0.03$), the switching layer may be deposited, for example, by low temperature ($\leq 300°$ C.) reactive sputtering. A titanium target may be exposed to an oxygen-containing plasma that partially oxidizes the surface of the target concurrently with sputtering material from the surface of the target. The oxygen content of the sputtered film may be set to a value in the desired range by controlling the oxygen flow rate in the sputtering chamber.

A photo resist may be deposited on top of the switching layer and patterned to define the memristor device locations at 626. After the photoresist is developed, the switching and barrier layers may be etched at 628 using, for example in an inductively coupled plasma (ICP) chamber using an CHF$_3$ plasma. The switching and barrier layers may be etched using other processes suitable for the material being etched. The residual photo resist may then be stripped at 630.

At 640 the upper electrodes, which run orthogonal to the lower electrodes, may be created using any known processes for creating metal conductors on a substrate. For example, the upper electrodes may be patterned using a lift-off process. At 642 a photoresist material may be deposited on the substrate, exposed through a mask, and developed to define the locations of the lower electrodes. A contact layer may be deposited over the developed photoresist at 644, followed by deposition of a conductor layer at 646. For example, the contact layer may be titanium about 15 nm thick and the conductor layer may be platinum 25 to 60 nm thick. Both metals may be deposited by electron-beam evaporation, thermal evaporation, sputtering, or any other processes suitable for depositing these materials. After deposition of the metal layers, the photoresist may be stripped at 648, which lifts off the excess metal, leaving the lower electrodes. Alternatively, at 640, the upper electrodes may be created using a subtractive process in which blanket contact and conductor layers are deposited on the substrate, resist is deposited and patterned on top of the metal layers, and the excess metal is removed by etching.

After creation of the upper electrodes, substrates or excised devices may be annealed at 660. Annealing may be performed at or near a recrystalization temperature of the switching layer. Annealing may lower memristor switching voltage and improve memristor uniformity by recrystalizing the switching layer and causing diffusion of the contact layer into the switching layer. For example, substrates or devices including a TiO$_{2-x}$ switching layer may be annealed in a reducing atmosphere (10% H$_2$, 90% N$_2$) for 30 minutes at 300° C. Other annealing conditions and/or durations may be used.

After annealing, the memristor device or each individual memristor device within a memristor array must be formed at 680. The process 600 may then end at 695.

Figure 7:
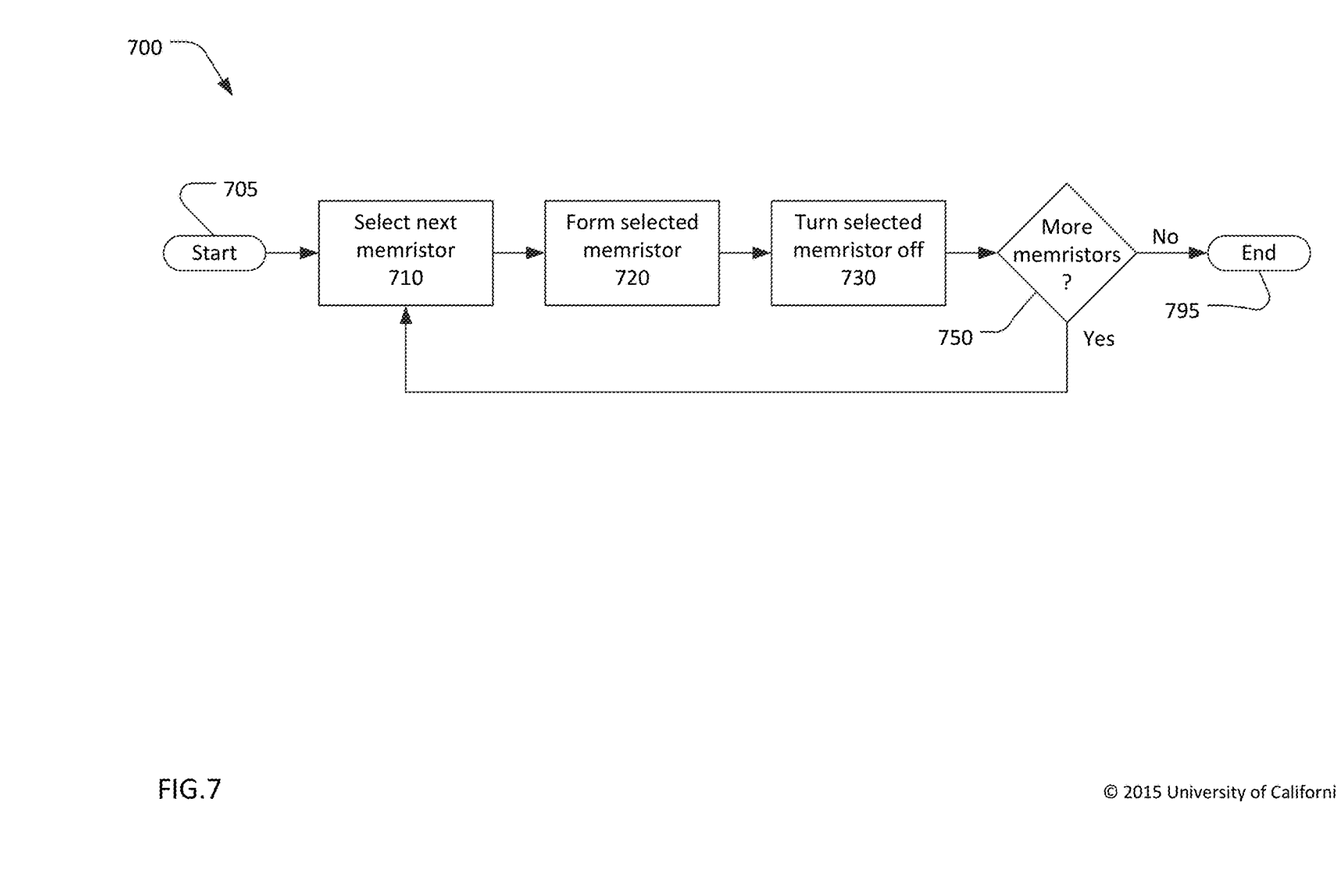
FIG. 7 is a flow chart of a process for forming memristors within a memristor array.

FIG. 7 is a flow chart of a process 700 for forming memristor devices within a memristor array, which may be suitable for use at 680 in the process 600. The process 700 starts at 705 after a memristor array has been fabricated and packaged. The process 700 ends at 795 after all memristor devices have been formed.

At 710, an unformed memristor may be selected from among the memristor devices in the memristor array. At 720, the selected memristor may be formed. To form the selected memristor, a current-limited DC voltage may be applied between the row and column electrodes connected to the selected memristor, with the other row and column electrodes floating. The applied voltage may be gradually increased to the forming voltage of the memristor, where an abrupt increase in current thought the memristor occurs. Equivalently and alternatively, a DC current may be forced through the selected memristor via the associated row and column electrodes, with the other row and column electrodes floating. The current may be gradually increased until the voltage across the memristor reaches the forming voltage, where an abrupt drop in the voltage across the device occurs as shown in FIG. 4. With either technique, forming is a one-time operation after which the memristor exhibits switching behavior as previously described.

To minimize the total current through a memristor array during forming, the selected memristor (which was just formed at 720) may be turned off at 730. To turn the selected memristor off, a voltage less than the memristor negative switching threshold may be applied between the row and column electrodes connected to the selected memristor.

After the memristor that was formed at 720 is turned off at 730, a determination may be made at 750 whether or not additional memristors within the array require forming. If there are additional memristors to be formed ("yes" at 750), the process 700 may be repeated from 710 until all memristors have been formed. When all memristors have been formed ("No" at 750), the process 700 may end at 795.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A memristor, comprising:
    a stack of four functional elements including, in sequence:
        a first electrode;
        a barrier layer;
        a TiO$_{2-x}$ switching layer, where 0.023<x<0.030; and
        a second electrode, wherein
        the TiO$_{2-x}$ switching layer is disposed between the barrier layer and the second electrode without any intervening layers.

2. The memristor of claim 1, wherein the barrier layer is one of Al$_2$O$_3$, AlN, and SiO$_2$.

3. The memristor of claim 2, wherein the barrier layer is Al$_2$O$_3$ and has a thickness of 3 to 5 nanometers.

4. The memristor of claim 1, wherein
    the second electrode includes a contact/getter layer adjacent to the TiO$_{2-x}$ switching layer, and
    the contact/getter layer provides a resistive contact to the TiO$_{2-x}$ switching layer and removes oxygen from the TiO$_{2-x}$ switching layer at the interface between the contact/getter layer and the TiO$_{2-x}$ switching layer.

5. The memristor of claim 4, wherein
    the contact/getter layer is titanium.

6. A memristor array, comprising:

a plurality of first electrodes extending in parallel in a first direction;

a plurality of second electrodes extending in parallel in a second direction different from the first direction;

a plurality of memristor devices, each memristor device disposed at an intersection of a respective first electrode and a respective second electrode, each memristor device comprising a barrier layer and a $TiO_{2-x}$ switching layer, where $0.023<x<0.030$, sandwiched between the respective first electrode and the respective second electrode, the $TiO_{2-x}$ switching layer disposed between the barrier layer and the respective second electrode without any intervening layers.

7. The memristor array of claim 6, wherein the barrier layer of each of the plurality of memristor devices is one of $Al_2O_3$, AlN, and $SiO_2$.

8. The memristor array of claim 7, wherein the barrier layer of each of the plurality of memristor devices is $Al_2O_3$ and has a thickness of 3 to 5 nanometers.

9. The memristor array of claim 6, wherein each of the plurality of second electrodes includes a contact/getter layer adjacent to the $TiO_{2-x}$ switching layer, and the contact/getter layer provides a resistive contact to the $TiO_{2-x}$ switching layer and removes oxygen from $TiO_{2-x}$ switching layer at the interface between the contact/getter layer and the $TiO_{2-x}$ switching layer.

10. The memristor of claim 9, wherein the contact/getter layer is titanium.

* * * * *